United States Patent
Chien et al.

(10) Patent No.: US 12,457,705 B2
(45) Date of Patent: Oct. 28, 2025

(54) PROJECTION DEVICE AND PARAMETER ADJUSTMENT METHOD THEREOF

(71) Applicant: Coretronic Corporation, Hsin-Chu (TW)

(72) Inventors: Wei-Min Chien, Hsin-Chu (TW); Yi-Cheng Hou, Hsin-Chu (TW); Tung-Chou Hu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 468 days.

(21) Appl. No.: 17/939,872

(22) Filed: Sep. 7, 2022

(65) Prior Publication Data

US 2023/0080165 A1 Mar. 16, 2023

(30) Foreign Application Priority Data

Sep. 9, 2021 (CN) .......................... 202111054774.9

(51) Int. Cl.
*H05K 7/20* (2006.01)
*G03B 21/16* (2006.01)
*H04R 3/00* (2006.01)
*H04R 29/00* (2006.01)

(52) U.S. Cl.
CPC .......... *H05K 7/20209* (2013.01); *G03B 21/16* (2013.01); *H04R 3/00* (2013.01); *H04R 29/001* (2013.01)

(58) Field of Classification Search
CPC ...... H05K 7/20209; G03B 21/16; H04R 3/00; H04R 29/001; H04R 1/028; H04R 2499/15; H04R 1/021
See application file for complete search history.

(56) References Cited

U.S. PATENT DOCUMENTS

| | | | | |
|---|---|---|---|---|
| 2014/0016105 A1* | 1/2014 | Kihara | .................. | G03B 21/14 |
| | | | | 353/121 |
| 2016/0261833 A1* | 9/2016 | Suzuki | .................. | H05B 47/10 |
| 2017/0322514 A1* | 11/2017 | Erad | ........................ | G09F 1/12 |

FOREIGN PATENT DOCUMENTS

| | | |
|---|---|---|
| CN | 2795896 | 7/2006 |
| CN | 101727115 | 6/2010 |
| CN | 102102679 | 6/2011 |
| CN | 203416478 | 1/2014 |

(Continued)

OTHER PUBLICATIONS

"Office Action of China Counterpart Application", issued on May 30, 2025, p. 1-p. 15.

*Primary Examiner* — Charles Cai
(74) *Attorney, Agent, or Firm* — JCIPRNET

(57) ABSTRACT

The disclosure provides a projection device and a parameter adjustment method thereof. An environment detection value is received from a detection module through a control chip, wherein the environment detection value is at least one of an environment illuminance value, a volume load value and an environment volume value. Then, the environment detection value is compared with a reference range to obtain a corresponding environment mode. Furthermore, a rotation speed of a fan module is adjusted according to an environment load value corresponding to the environment mode. The projection device and the parameter adjustment method thereof provided by the invention make the illuminance and noise output of the projection device more suitable for the operation condition.

20 Claims, 5 Drawing Sheets

(56) References Cited

FOREIGN PATENT DOCUMENTS

| | | | | |
|---|---|---|---|---|
| CN | 104142603 A | * | 11/2014 | |
| CN | 104154021 | | 11/2014 | |
| CN | 205608361 | | 9/2016 | |
| CN | 206957959 | | 2/2018 | |
| CN | 109386489 | | 2/2019 | |
| CN | 109855185 | | 6/2019 | |
| CN | 212838522 | | 3/2021 | |
| CN | 213750640 U | * | 7/2021 | |
| JP | 2012198439 | | 10/2012 | |
| TW | I436153 | | 5/2014 | |

* cited by examiner

PROJECTION DEVICE AND PARAMETER ADJUSTMENT METHOD THEREOF

CROSS-REFERENCE TO RELATED APPLICATION

This application claims the priority benefit of China application serial no. 202111054774.9, filed on Sep. 9, 2021. The entirety of the above-mentioned patent application is hereby incorporated by reference herein and made a part of this specification.

BACKGROUND OF THE DISCLOSURE

Field of the Disclosure

The disclosure relates to a projection device and a setting method thereof, and more particularly to a projection device and a parameter adjustment method thereof.

Description of Related Art

Nowadays people have higher requirements on the optical quality and noise minimization of projection devices (projectors). When adopting the same projection device in different environments, there may be different perceptions of noise. For example, under the condition that the noise generated by the projection device itself is 35 dB(A), if the projection device is operated during the day in an office or conference room where the background volume is between 40 dB(A) and 60 dB(A), then the noise generated by the projection device is almost unnoticeable. If the projection device is operated in a place such as one's own residence where people talk with a smaller volume (for example, the background volume is about 30 dB(A)), although the noise generated by the projection device may be noticed, such noise may not cause much interference.

In the condition of operating the projection device in a bedroom at night where the background volume is between 10 dB(A) and 20 dB(A), the noise with volume at 35 dB(A) generated by the projection device is an obvious source of noise and makes people feel disturbed.

Generally speaking, the illuminance projected by a projection device is closely related to the noise generated. That is, if the light source module outputs light with higher illuminance, since the light source module needs to be input with higher energy, more heat accumulation may be generated in the light source module. When the temperature of the light source module rises, the rotation speed of the fan needs to be increased for cooling, and therefore the projection device may cause loud noise. Conversely, if the light source module outputs light with low illuminance, since the light source module does not need to be input with high energy, it may not generate too much heat accumulation in the light source module. In the case that the temperature of the light source module is not significantly increased, a low rotation speed of fan is sufficient to cool the light source module, which may reduce the noise generated by the projection device.

In addition, the illuminance projected by the projection device is also closely related to the ambient illuminance. If the projection device is operated in a workplace with an ambient illuminance of 750 lux to 1500 lux, assuming that the projection device is to project the image beam onto a 100-inch screen, the projection device may need to project an illuminance of 4000 lm and above so that the projected image may be seen clearly. If the scenario of operating the projection device is in a workplace where the ambient illuminance is between 300 lux and 750 lux, the illuminance projected by the projection device is about 2000 lm, which is sufficient for the image projected onto a 100-inch screen to be seen clearly. If the projection device is operated in a residential indoor area where the ambient illuminance is between 30 lux and 150 lux, the illuminance projected by the projection device only needs to reach 500 lm to project sufficient illuminance on a 100-inch screen for users to see a clear image.

In summary of the above, whether the illuminance and noise output by the projection device will cause interference to the user does not depend on the illuminance or noise meets a certain specification, but depends on different requirements in different operation scenarios.

The illuminance projected by the projection device is not fixed, but is highly related to the external environment. In a projection device with a fixed size and specification, a higher rotation speed of fan is required for cooling when an image with a higher illuminance is to be projected, and therefore the noise generated by the projection device will increase. If a low rotation speed of fan is adopted for cooling, the noise problem may be solved, but only images with lower illuminance may be projected. In addition, taking into consideration the operation environment of the projection device, since the background noise tolerable by the user in the daytime environment is louder than that at night, normally the user may tolerate louder noise if the projection device is operated in the daytime. Although the user's requirements for noise minimization may increase when operating the projection device at night, the projection device is only required to output images with lower illuminance. Therefore, how to make the projection device to automatically achieve balance between noise and illuminance is currently one of the most important issues.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY OF THE DISCLOSURE

The disclosure provides a projection device and a parameter adjustment method thereof, so that the illuminance and noise output of the projection device are more suitable for the operation situation.

The parameter adjustment method of the projection device of the disclosure includes: receiving an environment detection value through a control chip from a detection module, and the environment detection value is at least one of an environment illuminance value, a volume load value, and an environment volume value; comparing the environment detection value with a reference range to obtain the corresponding environment mode; and adjusting the rotation speed of the fan module according to the environment load value corresponding to the environment mode.

In an embodiment of the disclosure, the step of comparing the environment detection value with a reference range to obtain the corresponding environment mode includes: when the environment detection value falls within the reference range, adopting the first mode as the environment mode; when the environment detection value is less than the lower limit of the reference range, adopting the second mode as the environment mode; and when the environment detection value is greater than the upper limit of the reference range, adopting the third mode as the environment mode; the environment load value corresponding to the third mode is greater than the environment load value corresponding to the first mode, and the environment load value corresponding to the second mode is less than the environment load value corresponding to the first mode.

In an embodiment of the disclosure, the step of comparing the environment detection value with a reference range to obtain the corresponding environment mode further includes: when the environment detection value is greater than the upper limit of the reference range and is not greater than the preset value, adopting the third mode as the environment mode; and when the environment detection value is greater than the preset value, adopting the fourth mode as the environment mode; the environment load value corresponding to the fourth mode is greater than the environment load value corresponding to the third mode.

In an embodiment of the disclosure, the detection module is an illuminance sensor, and the environment detection value is the environment illuminance value.

In an embodiment of the disclosure, the detection module is a current sensor, and the environment detection value is the volume load value of a speaker module.

In an embodiment of the disclosure, the detection module is a volume sensor, and the environment detection value is the environment volume value.

In an embodiment of the disclosure, the step of receiving the environment detection value through the control chip from the detection module further includes: receiving a plurality of the environment detection values within a time period; determining whether the difference between the maximum value and the minimum value of the plurality of environment detection values is greater than a threshold value; when the difference is not greater than the threshold value, obtaining the corresponding environment mode according to the average value of the plurality of environment detection values; and when the difference is greater than the threshold value, receiving other multiple environment detection values again from the detection module in the next time period to obtain the corresponding environment mode.

In an embodiment of the disclosure, the parameter adjustment method further includes: adjusting the light power of the light source module of the projection device according to the environment load value, when the rotation speed of the fan module increases, increasing the light power, when the rotation speed of the fan module is reduced, decreasing the light power.

In an embodiment of the disclosure, the number of the detection modules is multiple, and the parameter adjustment method further includes: receiving the plurality of environment detection values through the control chip from the multiple detection modules; comparing the plurality of environment detection values with the corresponding reference ranges respectively to obtain a plurality of comparison results; selecting the lowest speed among the rotation speeds of the plurality of fan modules corresponding to the plurality of comparison results; and adjusting the rotation speed of the fan module according to the lowest speed.

The projection device of the disclosure includes a fan module, a detection module, and a control chip. The detection module is configured to sense an environment detection value. The environment detection value is at least one of an environment illuminance value, a volume load value, and an environment volume value. The control chip is coupled to the fan module and the detection module. The control chip is configured to receive the environment detection value from the detection module, and compare the environment detection value with a reference range to obtain a corresponding environment mode, and adjust the rotation speed of the fan module according to the environment load value corresponding to the environment mode.

Based on the above, the projection device determines the current environment mode according to the environment detection value, and then automatically adjusts the rotation speed of the fan module according to the determined environment mode. Accordingly, the illuminance and noise output of the projection device may be more suitable for the operation situation, and the user experience may be improved.

Other objectives, features and advantages of the present disclosure will be further understood from the further technological features disclosed by the embodiments of the present disclosure wherein there are shown and described preferred embodiments of this disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

It is to be understood that other embodiment may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
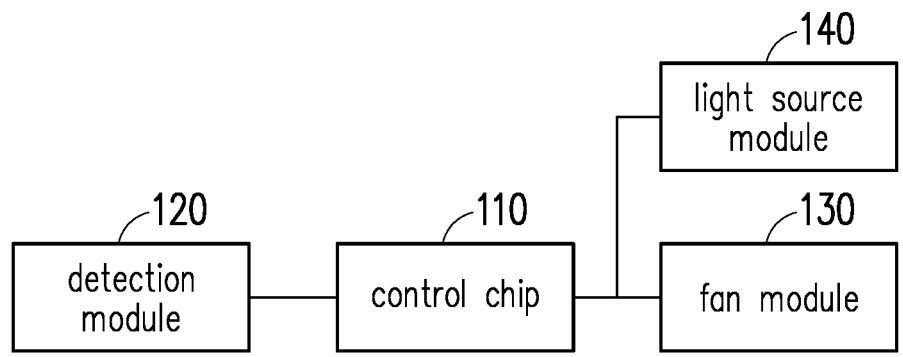
FIG. 1 is a block diagram of a projection device according to an embodiment of the disclosure.

FIG. 1 is a block diagram of a projection device according to an embodiment of the disclosure. Referring to FIG. 1, the projection device 100 includes physical hardware components, such as a control chip 110, a detection module 120, a fan module 130 and a light source module 140. The control chip 110 is coupled to the detection module 120, the fan module 130 and the light source module 140.

The control chip 110 is, for example, a central processing unit (CPU), a physics processing unit (PPU), a programmable microprocessor, an embedded control chip, a digital signal processor (DSP), an application specific integrated circuit (ASIC) or other similar devices.

The detection module 120 is configured to sense the environment detection value. The environment detection value is at least one of an environment illuminance value, a volume load value, and an environment volume value. The detection module 120 is, for example, an illuminance sensor, a current sensor, or a volume sensor. In an embodiment, the detection module 120 detects an environment detection value at a single time point, and the control chip 110 obtains the corresponding environment mode according to the environment detection value. In another embodiment, the detection module 120 can also be configured to detect multiple environment detection values at multiple time points in a time period. Then, the control chip 110 determines whether the difference between the maximum value and the minimum value among the environment detection values is greater than the threshold value. When the difference is not greater than the threshold value, the control chip 110 obtains the corresponding environment mode according to the average value of the plurality of environment detection values. When the difference is greater than the threshold value, the control chip 110 receives other multiple environment detection values again from the detection module 120 in the next time period to obtain the corresponding environment mode. In this way, it may be ensured that the multiple environment detection values detected by the detection module 120 are illuminance or noise stably present in the current environment.

The fan module 130 is configured for heat dissipation. The fan module 130 includes, for example, a motor and blades, and the motor converts electrical energy into mechanical energy to drive the blades to rotate.

The light source module 140 is configured to control the illuminance of projection image performed by the projection device 100. The light source module 140 includes a light source such as a bulb light source, a light-emitting diode (LED) light source, or a laser light source.

Figure 2:
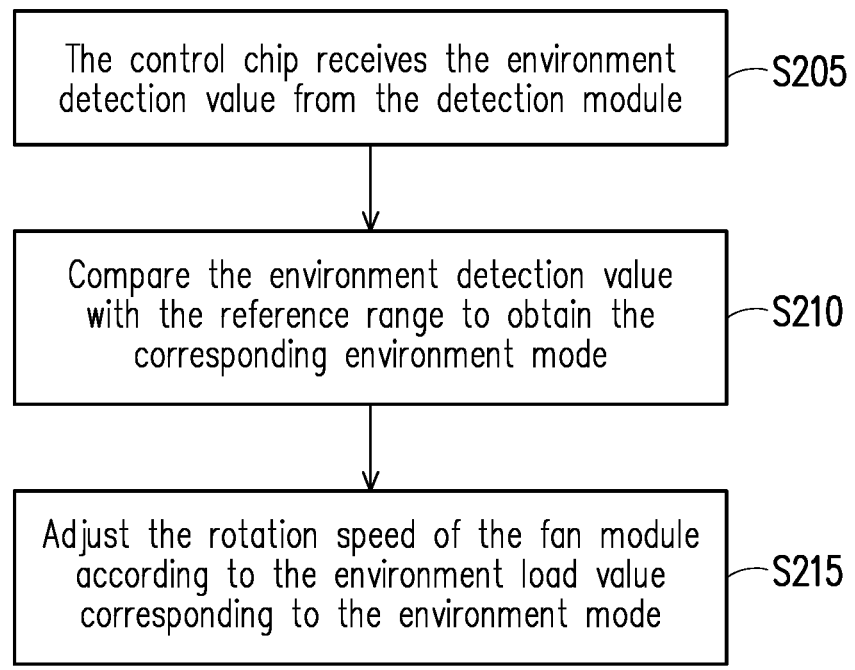
FIG. 2 is a flowchart of a parameter adjustment method of a projection device according to an embodiment of the disclosure.

FIG. 2 is a flowchart of a parameter adjustment method of a projection device according to an embodiment of the disclosure. Please refer to FIGS. 1 and 2 at the same time. In this embodiment, whenever the projection device 100 is re-started or receives a related instruction issued by the user, the control chip 110 may drive the detection module 120 to detect a current environment detection value to obtain the corresponding environment mode. The specific description is as follows.

In step S205, the control chip 110 receives the environment detection value from the detection module 120. For example, when an illuminance sensor is adopted as the detection module 120, the received environment detection value is an environment illuminance value. When a current sensor is adopted as the detection module 120, the received environment detection value is the volume load value of a speaker module (not shown in the figure). When a volume sensor is adopted as the detection module 120, the received environment detection value is the environment volume value.

In step S210, the control chip 110 compares the environment detection value with the reference range to obtain the environment mode corresponding to the current environment. Specifically, different types of environment detection values have different reference ranges. In terms of environment illuminance value, the reference range can be set from 500 lux to 1000 lux. In terms of the volume load value of the speaker module, the reference range that can be set is 25% to 50% of the speaker load. In terms of environment volume value, the reference range can be set from 30 dB(A) to 40 dB(A). The environment load value is, for example, the bearable projection noise (dB) in the determined environment mode, the rotation speed of the fan module corresponding to the determined environment mode, the projected image illuminance or the output light power (W) in the determined environment mode. Different environment modes have different environment load values.

Figure 3:
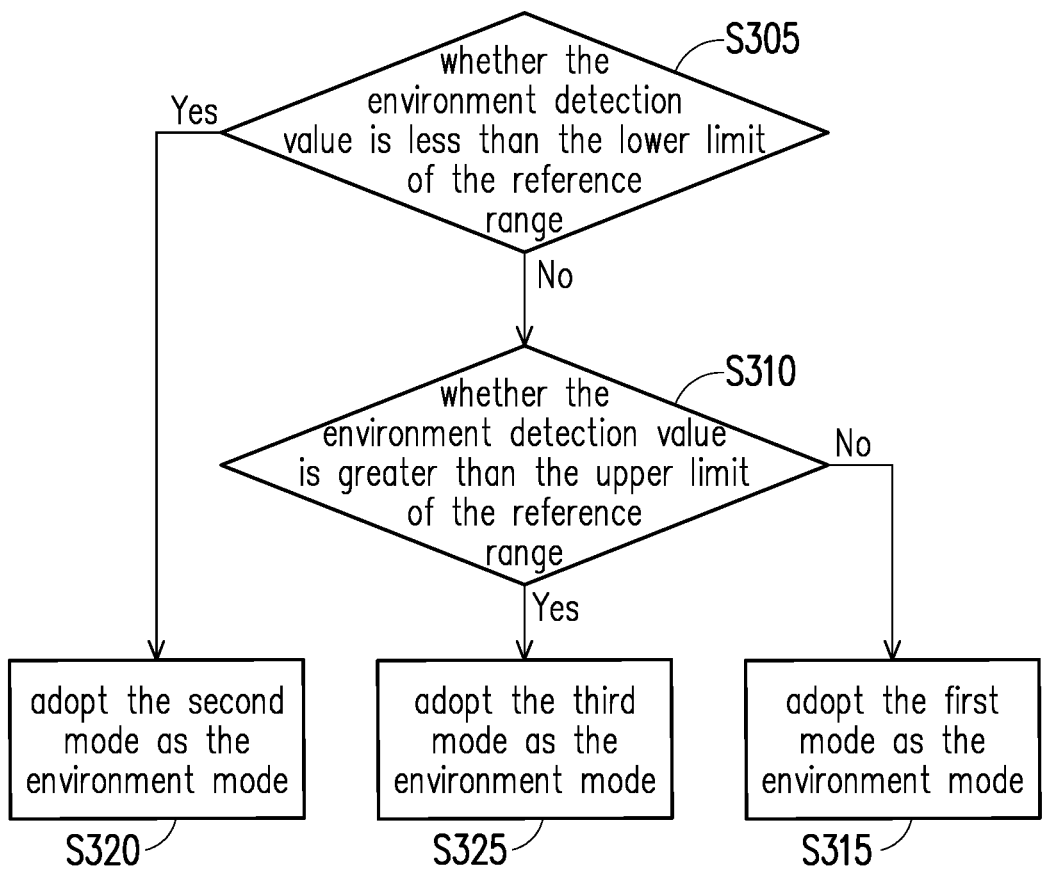
FIG. 3 is a flowchart of determining an environment mode according to an embodiment of the disclosure.

In an embodiment, the environment mode includes a first mode, a second mode, and a third mode. The control chip 110 determines the environment mode is the first mode, the second mode, or the third mode by determining whether the environment detection value falls within the reference range. FIG. 3 is a flowchart of determining an environment mode according to an embodiment of the disclosure. Please refer to FIG. 1 and FIG. 3 at the same time, in step S305, the control chip 110 determines whether the environment detection value is less than the lower limit of the reference range. When the environment detection value is not less than the lower limit of the reference range ("NO" in step S305), in step S310, the control chip 110 determines whether the environment detection value is greater than the upper limit of the reference range. When the environment detection value is not less than the lower limit of the reference range ("NO" in step S305) and is not greater than the upper limit of the reference range ("NO" in step S310), that is, when the environment detection value falls within the reference range, in step S315, the control chip 110 adopts the first mode as the environment mode.

When the environment detection value is less than the lower limit of the reference range ("YES" in step S305), in step S320, the control chip 110 adopts the second mode as the environment mode. The environment load value corresponding to the second mode is less than the environment load value corresponding to the first mode.

When the environment detection value is greater than the upper limit of the reference range ("YES" in step S310), in step S325, the control chip 110 adopts the third mode as the environment mode. The environment load value corresponding to the third mode is greater than the environment load value corresponding to the first mode.

Figure 4:
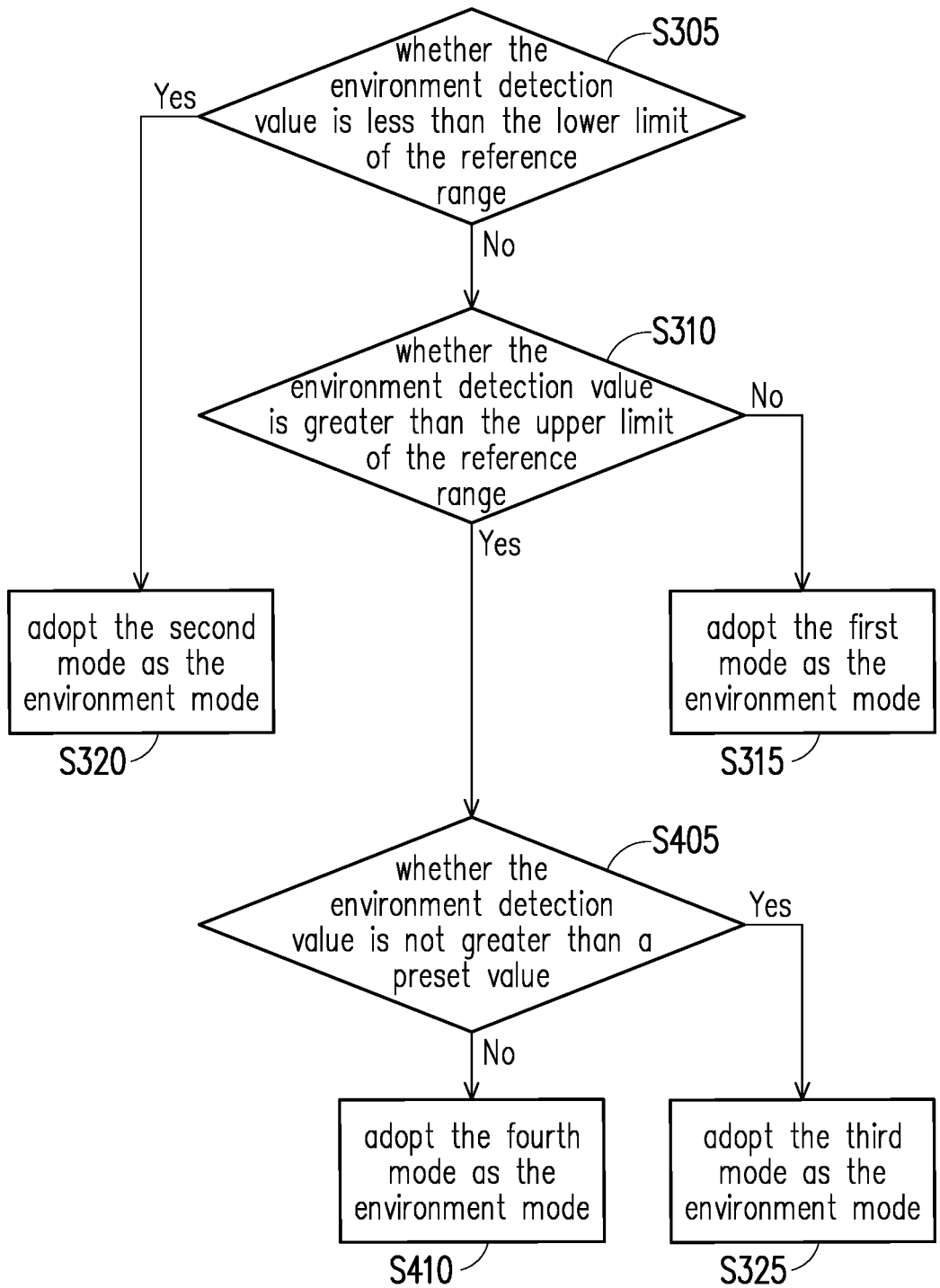
FIG. 4 is a flowchart of determining an environment mode according to another embodiment of the disclosure.

In addition, in another embodiment, the environment mode includes a first mode, a second mode, a third mode, and a fourth mode. FIG. 4 is a flowchart of determining an environment mode according to another embodiment of the disclosure. The embodiment shown in FIG. 4 is an extensive application example based on the embodiment shown in FIG. 3. When the environment detection value is greater than the upper limit of the reference range ("YES" in step S310), the control chip 110 further performs step S405 to determine whether the environment detection value is not greater than a preset value. Here, the preset value is greater than the upper limit of the reference range. When the environment detection value is greater than the upper limit of the reference range ("YES" in step S310) and not greater than the preset value ("YES" in step S405), in step S325, the control chip 110 adopts the third mode as the environment mode. When the environment detection value is greater than the upper limit of the reference range ("YES" in step S310) and greater than the preset value ("NO" in step S405), in step S410, the control chip 110 adopts the fourth mode as the environment mode. Here, the environment load value corresponding to the fourth mode is greater than the environment load value corresponding to the third mode.

Returning to FIG. 2, after determining the environment mode, in step S215, the control chip 110 adjusts the rotation speed of the fan module 130 according to the environment load value corresponding to the environment mode. For example, in the storage (not shown in the figure) of the projection device 100, different environment load values may be set and stored in advance according to different environment modes. After the environment mode is determined, the previous settings are queried to obtain the corresponding environment load values, thereby adjusting the rotation speed of the fan module 130.

Figure 5:
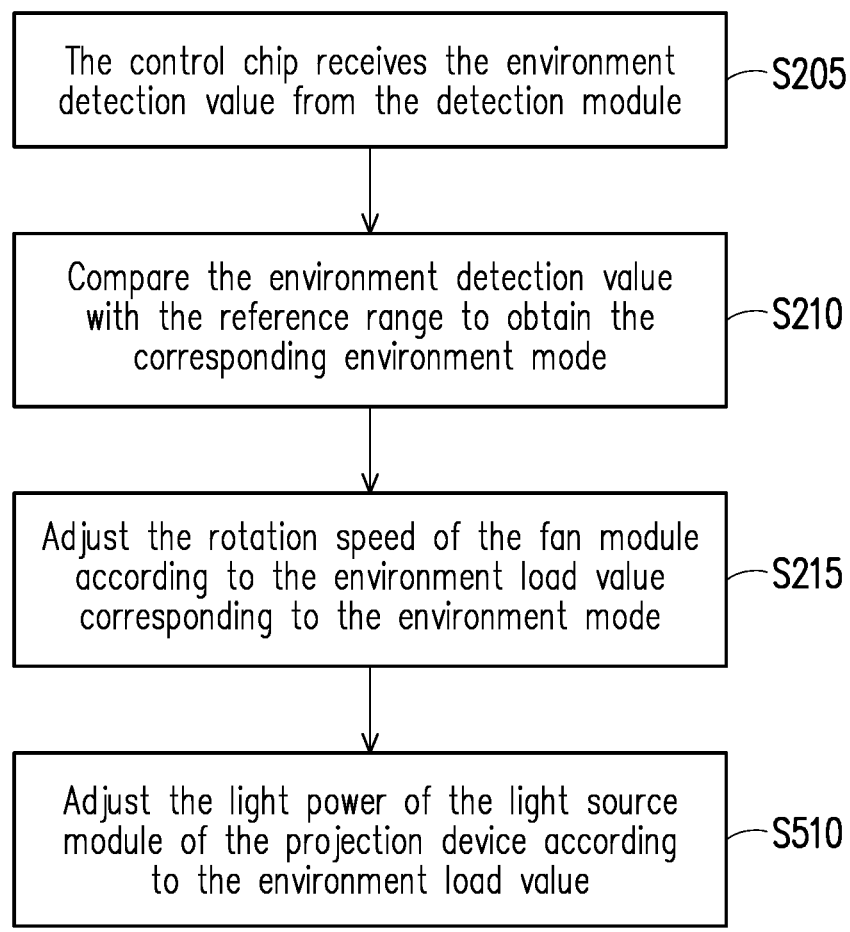
FIG. 5 is a flowchart of a parameter adjustment method of a projection device according to an embodiment of the disclosure.

FIG. 5 is a flowchart of a parameter adjustment method of a projection device according to an embodiment of the disclosure. The embodiment shown in FIG. 5 is an application example of the embodiment shown in FIG. 2. That is, after step S215, the control chip 110 may further perform step S510 to adjust the light power of the light source module 140 of the projection device 100 according to the environment load value. When the rotation speed of the fan module 130 increases, the light power increases, and when the rotation speed of the fan module 130 decreases, the light power decreases. In another embodiment, the control chip 110 may simultaneously perform step S215 of adjusting the rotation speed of the fan module 130 and step S510 of adjusting the light power to simultaneously update the output of the illuminance and noise of the projection device 100.

Table 1 shows the setting parameters corresponding to four environment modes for different main projection modes in an embodiment.

illuminance 500 lm is adopted as the corresponding environment load value. Under the circumstances, the control chip 110 adjusts the rotation speed of the fan module 130 according to the corresponding fan load 60%, and may further adjust the light power of the light source module 140 to 32 W.

When the detected environment illuminance value is less than 100 lux, the environment mode is the second mode M2 (dimming mode), and the image illuminance 450 lm is adopted as the corresponding environment load value. Under the circumstances, the control chip 110 adjusts the rotation speed of the fan module 130 according to the corresponding fan load 55%, and may further adjust the light power of the light source module 140 to 28 W.

When the detected environment illuminance value is greater than 500 lux and not greater than 1000 lux, the environment mode is the third mode M3 (the first-stage brightness mode), and the image illuminance 510 lm is adopted as the corresponding environment load value. Under the circumstances, the control chip 110 adjusts the rotation speed of the fan module 130 according to the corresponding fan load 65%, and may further adjust the light power of the light source module 140 to 32 W.

When the environment illuminance value is greater than 1000 lux, the environment mode is the fourth mode M4 (the second-stage brightening mode), and the image illuminance 520 lm is adopted as the environment load value. Under the circumstances, the control chip 110 adjusts the rotation speed of the fan module 130 according to the corresponding fan load 70%, and can further adjust the light power of the light source module 140 to 32 W.

In the description below, the current sensor is exemplified as the detection module 120 and the environment detection

TABLE 1

| | Main projection modes | | | | | | | | | | | |
|---|---|---|---|---|---|---|---|---|---|---|---|---|
| | Highlight mode | | | | Theater mode | | | | Energy-saving mode | | | |
| Environment mode | M1 | M2 | M3 | M4 | M1 | M2 | M3 | M4 | M1 | M2 | M3 | M4 |
| Light power (W) | 32 | 28 | 32 | 32 | 22 | 20 | 24 | 26 | 7 | 6 | 8.5 | 10 |
| Fan load (%) | 60 | 55 | 65 | 70 | 40 | 35 | 45 | 50 | 35 | 30 | 40 | 40 |
| Image illuminance (lm) | 500 | 450 | 510 | 520 | 300 | 270 | 330 | 360 | 150 | 135 | 165 | 180 |
| Noise (dB(A)) | 35 | 33 | 37 | 39 | 27 | 25 | 29 | 31 | 25 | 22 | 27 | 27 |

In the embodiment shown in Table 1, the projection device 100 has three main projection modes, including a highlight mode, a theater mode, and an energy-saving mode. The main projection mode is for users to choose according to different scenarios. After the main projection mode is selected, the control chip 110 determines the corresponding environment mode according to the current environment illuminance value. The number of environment modes may be adjusted according to the user's needs. Here, four environment modes are adopted for exemplary description.

In the description below, the illuminance sensor is exemplified as the detection module 120 and the environment detection value is exemplified as the environment illuminance value. Here, taking the case of selecting the highlight mode in Table 1 as an example, assuming that the reference range corresponding to the environment illuminance value is 100 lux to 500 lux, and the preset value is 1000 lux. When the detected environment illuminance value falls in a range between 100 lux and 500 lux, the environment mode is the first mode M1 (preset illuminance mode), and the image value is exemplified as the volume load value of the speaker module. The volume load value of the speaker may be set from 0% (silent) to 100% (maximum). Table 2 shows the setting parameters corresponding to four environment modes in an embodiment.

TABLE 2

| Environment mode | M1 | M2 | M3 | M4 |
|---|---|---|---|---|
| Fan load % | A | A × 95% | A × 105% | A × 110% |
| Noise dB(A) | B | B − 1 | B + 1 | B + 3 |

In the embodiment shown in Table 2, A and B represent different values. Here, assuming that the reference range corresponding to the volume load value is 25% to 50%, and the preset value is 75%.

When the volume load value detected by the detection module 120 falls in a range between 25% and 50%, the environment mode is the first mode M1 (normal external noise mode), and the projection noise B dB(A) is adopted as the environment load value. Under the circumstances, the control chip 110 adjusts the rotation speed of the fan module 130 according to the corresponding fan load A %.

When the volume load value detected by the detection module 120 is less than 25%, the environment mode is the second mode M2 (low external noise mode), and the projection noise B-1 dB(A) is adopted as the environment load value. Under the circumstances, the control chip 110 adjusts the rotation speed of the fan module 130 according to the corresponding fan load A×95%.

When the volume load value detected by the detection module 120 is greater than 50% and not greater than 75%, the environment mode is the third mode M3 (high external noise mode), and the projection noise B+1 dB(A) is adopted as the environment load value. Under the circumstances, the control chip 110 adjusts the rotation speed of the fan module 130 according to the corresponding fan load A×105%.

When the volume load value detected by the detection module 120 is greater than 75%, the environment mode is the fourth mode (extremely high external noise mode), and the projection noise B+3 dB(A) is adopted as the environment load value. Under the circumstances, the control chip 110 adjusts the rotation speed of the fan module 130 according to the corresponding fan load A×110%.

In the case that the volume load value of the speaker module is set to be greater than 75%, it may be determined that the projection device 100 is in the following two states: the first state is an environment with extremely high external noise, in which the speaker module is required to output a loud volume for the user to hear the sound clearly; the second state is a circumstances where the user might be immersed in the sound and light effect output by the projection device 100, and the speaker module is required to output a loud volume to achieve a better user experience. In these two scenarios, the user is less aware of the noise generated by the projection device 100 itself. When the rotation speed of the fan module 130 is set to increase by 10%, generally the noise is increased by about 3 dB(A). However, the increase of noise by 3 dB(A) is not obviously noticeable in the above-mentioned situation. In addition, increasing the rotation speed of the fan module 130 by 10% may bring many additional benefits for the projection device 100. For example, the image illuminance output by the projection device 100 may be further increased by about 2 to 7%, and the service life of the light valve (such as digital micromirror device (DMD)) may be increased by about 13 to 27%.

In the description below, the volume sensor is exemplified as the detection module 120 and the environment detection value is exemplified as the environment volume value. For example, a directional microphone may be adopted as a volume sensor. This detection device may more directly detect the background noise of the environment where the user is located and is not easily affected by noise sources inside the projection device 100. The volume sensor directly detects the surrounding environment volume (environment detection value), and adjusts the rotation speed of the fan module 130 according to the surrounding environment volume. Here, it is assumed that the lower limit of the reference range corresponding to the environment volume value is 30 dB(A), and the upper limit is 40 dB(A). In addition, the setting parameters shown in Table 2 above can also be applied to the case where a volume sensor is exemplified as the detection module 120.

In an embodiment, when a volume sensor is exemplified as the detection module 120, the volume sensor may detect whether multiple environment volume values in a time period are similar. When the multiple environment volume values in the same time period are similar, it may more accurately reflect whether the environment in which the projection device 100 is located is noisy. In addition, a threshold value is set in advance, such as 10 dB(A), and the detection module 120 (volume sensor) starts to detect from the first time point t1 until the second time point t2, and determines whether the change in the environment volume value between the first time point t1 and the second time point t2 (take the maximum and minimum values to calculate the difference between the two) exceeds 10 dB (A). When the change in the environment volume value exceeds 10 dB (A), the detection is performed again; when the change in the environment volume value does not exceed 10 dB (A), it means that the detected volume should be the noise that often exists in the current environment, and a corresponding environment mode is obtained according to the average value of the multiple environment volume values between the first time point t1 and the second time point t2. The average value is compared with the corresponding reference range to determine the environment mode (refer to the process flow in FIG. 3 and FIG. 4).

When the average value of multiple environment volume values detected by the driven volume sensor during a time period falls in a range between 30 dB(A) and 40 dB(A), the environment mode is the first mode M1 (normal external noise mode), and the projection noise B dB(A) is adopted as the environment load value.

When the average value of the multiple environment volume values detected by the driven volume sensor during a time period is less than 30 dB(A), the environment mode is the second mode M2 (low external noise mode), and the projection noise B-1 dB(A) is adopted as the environment load value. Under the circumstances, the control chip 110 adjusts the rotation speed of the fan module 130 according to the corresponding fan load A×95%. In the second mode M2, the rotation speed of the fan module 130 may be decreased to reduce the volume of the noise generated by the projection device 100, so that the noise generated by the fan module 130 may not easily disturb the user.

When the average value of the multiple environment volume values detected by the driven volume sensor during a time period is greater than 45 dB(A), the environment mode is the third mode M3 (high external noise mode), and the projection noise B+1 dB(A) is adopted as the environment load value. Under the circumstances, the control chip 110 adjusts the rotation speed of the fan module 130 according to the corresponding fan load A×105%. In this condition, the noise generated by increasing the rotation speed of the fan module 130 is not easily noticeable, but the temperature of the light source may be reduced and the light source module 140 may emit higher illuminance, better color effects, or the life reliability of the projection device 100 may be improved.

In other embodiments, the projection device 100 may include a plurality of different types of detection side modules 120 simultaneously. For example, a plurality of environment detection values are received from a plurality of detection modules 120 through the control chip 110, and the plurality of environment detection values are respectively compared with corresponding reference ranges, thereby obtaining a plurality of comparison results. The multiple comparison results are, for example, environment modes or environment load values. The lowest speed is selected among the rotation speed of the fan load corresponding to the multiple comparison results, and the rotation speed of the fan module 130 is adjusted according to the lowest speed.

Figure 6:
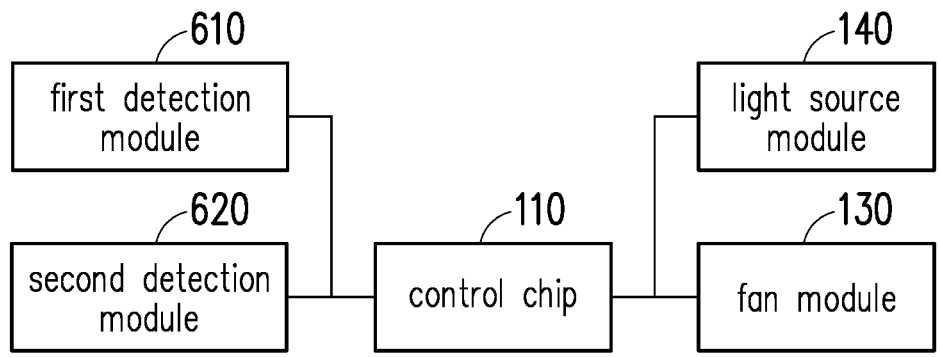
FIG. 6 is a block diagram of a projection device according to an embodiment of the disclosure.
Figure 7:
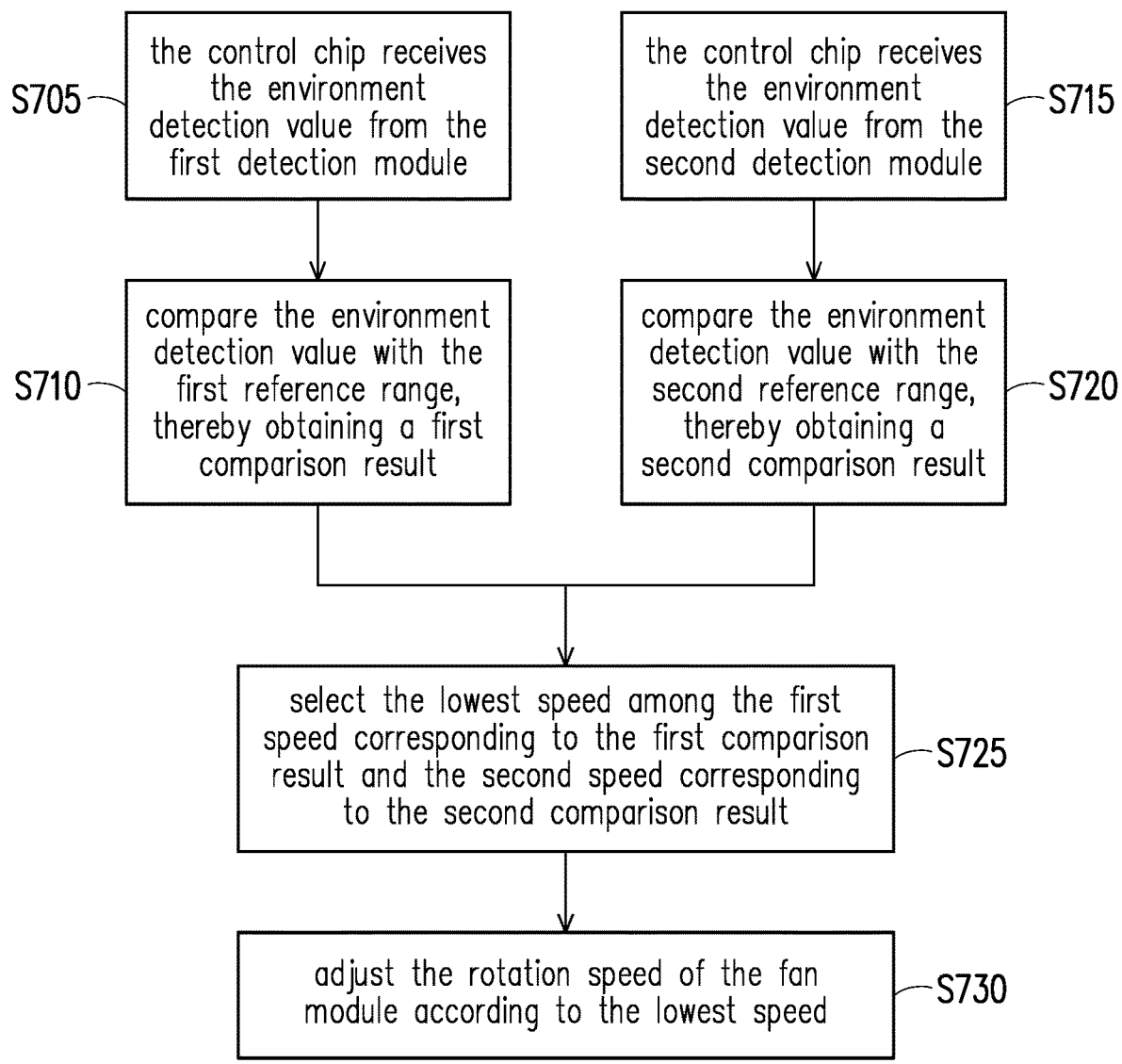
FIG. 7 is a flowchart of a parameter adjustment method of a projection device according to an embodiment of the disclosure.

FIG. 6 is a block diagram of a projection device according to an embodiment of the disclosure. FIG. 7 is a flowchart of a parameter adjustment method of a projection device according to an embodiment of the disclosure. In this embodiment, the projection device 600 adopts two detection modules, namely the first detection module 610 and the second detection module 620, which are respectively coupled to the control chip 110. However, such configuration is only for convenience of description, and the disclosure provides no limitation to the number of detection modules. In other embodiments, three or more detection modules may also be adopted. In addition, the functions of the control chip 110, the fan module 130, and the light source module 140 in FIG. 6 are the same as or similar to those in the embodiment shown in FIG. 1, and reference may be derived from the description of the above embodiment.

In step S705, the control chip 110 receives the environment detection value from the first detection module 610. In step S710, the control chip 110 compares the environment detection value received from the first detection module 610 with the corresponding first reference range, thereby obtaining a first comparison result. The first comparison result may be the corresponding environment mode or the environment load value. A first speed for adjusting the rotation speed of the fan module 130 may be acquired according to the first comparison result.

In step S715, the control chip 110 receives the environment detection value from the second detection module 620. In step S720, the control chip 110 compares the environment detection value received from the second detection module 620 with the corresponding second reference range, thereby obtaining a second comparison result. The second comparison result may be the corresponding environment mode or the environment load value. The second speed for adjusting the rotation speed of the fan module 130 may be acquired according to the second comparison result.

In step S725, among the first speed corresponding to the first comparison result and the second speed corresponding to the second comparison result, the control chip 110 selects the lowest speed. Thereafter, in step S730, the control chip 110 adjusts the rotation speed of the fan module 130 according to the lowest speed.

Another embodiment will be described below. The projection device 100 simultaneously adopts multiple detection modules 120 such as an illuminance sensor, a current sensor, and a volume sensor to detect the environment illuminance value, the volume load value of the speaker module, and the environment volume value respectively. The control chip 110 compares the environment illuminance value with the corresponding first reference range in the storage of the projection device 100 to obtain the first comparison result; compares the volume load value of the speaker module with the corresponding second reference range in the storage of the projection device 100 to obtain the second comparison result; and compares the environment volume value with the corresponding third reference range in the storage of the projection device 100 to obtain the third comparison result. Then, the control chip 110 selects the lowest speed among the rotation speeds of the fan module 130 corresponding to the first comparison result to the third comparison result, and adjusts the rotation speed of the fan module 130 according to the lowest speed. Through such design, the noise volume sensed by the user is the possibly lowest noise volume.

The various reference ranges, preset values, and thresholds defined in the above embodiments are all exemplary values, which can be adjusted according to requirements in actual applications.

In summary, the disclosure is a control logic applied to projection device. The projection device may automatically adjust the rotation speed of the fan module of the projection device and light power of the light source module through the environment detection value detected by the detection module, so that the state of the projection device is more adaptable for the operation scenario of the user.

While the rotation speed of the fan module changes, the maximum light power that the light source module may withstand is also different. For example, when the environment illuminance is high, the increase in the rotation speed of the fan module may improve the heat dissipation effect, and therefore the maximum light power that the light source module may withstand is also increased. Accordingly, the light power may be safely increased to increase the illuminance. Through the above embodiments, when the rotation speed of the fan module is increased due to the environment illuminance value, the volume load value or the environment volume value, the projection illuminance may be automatically increased together, so that the user may have a better user experience. Conversely, when the environment illuminance is low, the rotation speed of the fan module decreases and the heat dissipation effect is reduced accordingly, and the maximum light power that the light source module may withstand is also reduced. Therefore, if the light source module maintains the same light power as the original light power, it might cause the light source module to be overheated and damaged. Through the above embodiments, when the rotation speed of the fan module is reduced due to the environment illuminance value, volume load value or environment volume value, the projection illuminance may be automatically reduced together, which may reduce the noise experienced by the user while decreasing unnecessary projection illuminance, thereby improving the life of the light source.

The foregoing description of the preferred embodiments of the disclosure has been presented for purposes of illustration and description. It is not intended to be exhaustive or to limit the exemplary disclosure to the precise form or to embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A parameter adjustment method of a projection device, comprising:
   receiving a plurality of environment detection values through a control chip from a plurality of detection modules, wherein the plurality of environment detection values are an environment illuminance value and a volume load value, or the environment illuminance value and an environment volume value, or the volume load value and the environment volume value, or the environment illuminance value, the volume load value and the environment volume value;
   comparing each of the plurality of environment detection values with a corresponding reference range to obtain a plurality of comparison results, wherein the plurality of comparison results are corresponding environment modes or environment load values corresponding to the environment modes;
   selecting a lowest speed among a plurality of rotation speeds of a fan module corresponding to the plurality of comparison results; and
   adjusting the rotation speed of the fan module according to the lowest speed.

2. The parameter adjustment method of the projection device according to claim 1, wherein the step of comparing each of the plurality of environment detection values with the corresponding reference range to obtain the plurality of comparison results comprises:
   in response to the environment detection value falls within the corresponding reference range, adopting a first mode as the environment mode;
   in response to the environment detection value is less than a lower limit of the reference range, adopting a second mode as the environment mode; and
   in response to the environment detection value is greater than an upper limit of the reference range, adopting a third mode as the environment mode;
   wherein the environment load value corresponding to the third mode is greater than the environment load value corresponding to the first mode, and the environment load value corresponding to the second mode is less than the environment load value corresponding to the first mode.

3. The parameter adjustment method of the projection device according to claim 2, wherein the step of comparing each of the plurality of environment detection values with the corresponding reference range to obtain the plurality of comparison results further comprises:
   in response to the environment detection value is greater than the upper limit of the corresponding reference range and is not greater than a preset value, adopting the third mode as the environment mode; and
   in response to the environment detection value is greater than the preset value, adopting a fourth mode as the environment mode;
   wherein the environment load value corresponding to the fourth mode is greater than the environment load value corresponding to the third mode.

4. The parameter adjustment method of the projection device according to claim 1, wherein one of the plurality of detection modules is an illuminance sensor, and one of the plurality of environment detection values is the environment illuminance value.

5. The parameter adjustment method of the projection device according to claim 1, wherein one of the plurality of detection modules is a current sensor, and one of the plurality of environment detection values is the volume load value of a speaker module.

6. The parameter adjustment method of the projection device according to claim 1, wherein one of the plurality of detection modules is a volume sensor, and one of the plurality of environment detection values is the environment volume value.

7. The parameter adjustment method of the projection device according to claim 1, wherein the step of receiving the plurality of environment detection values through the control chip from the plurality of detection modules further comprises:
   receiving the plurality of the environment detection values within a time period;
   determining whether a difference between a maximum value and a minimum value of the plurality of environment detection values is greater than a threshold value;
   in response to the difference is not greater than the threshold value, obtaining the corresponding environment mode according to an average value of the plurality of environment detection values; and
   in response to the difference is greater than the threshold value, receiving another plurality of environment detection values again from the plurality of detection modules in a next time period to obtain the corresponding environment mode.

8. The parameter adjustment method of the projection device according to claim 1, further comprising:
   adjusting a light power of a light source module of the projection device according to the environment load value, wherein in response to the rotation speed of the fan module increases, increasing the light power, in response to the rotation speed of the fan module is reduced, decreasing the light power.

9. A projection device, comprising:
   a fan module;
   a plurality of detection modules, configured to sense a plurality of environment detection values, wherein the plurality of environment detection values are an environment illuminance value and a volume load value, or the environment illuminance value and an environment volume value, or the volume load value and the environment volume value, or the environment illuminance value, the volume load value and the environment volume value; and
   a control chip, coupled to the fan module and the plurality of detection modules, and the control chip is configured to receive the plurality of environment detection values from the plurality of detection modules, and compare each of the plurality of environment detection values with a corresponding reference range to obtain a plurality of comparison results, wherein the plurality of comparison results are corresponding environment modes or environment load values corresponding to the environment modes, selecting a lowest speed among a plurality of rotation speeds of the fan module corresponding to the plurality of comparison results; and adjust the rotation speed of the fan module according to the lowest speed.

10. The projection device according to claim 9, wherein the control chip is configured to adopt a first mode as the environment mode when the environment detection value falls within the corresponding reference range, adopt a second mode as the environment mode when the environment detection value is less than a lower limit of the corresponding reference range, and adopt a third mode as the environment mode when the environment detection value is greater than an upper limit of the corresponding reference range;

wherein the environment load value corresponding to the third mode is greater than the environment load value corresponding to the first mode, and the environment load value corresponding to the second mode is less than the environment load value corresponding to the first mode.

11. The projection device according to claim 10, wherein the control chip is configured to adopt the third mode as the environment mode when the environment detection value is greater than the upper limit of the corresponding reference range and is not greater than a preset value, and adopt a fourth mode as the environment mode when the environment detection value is greater than the preset value;

wherein the environment load value corresponding to the fourth mode is greater than the environment load value corresponding to the third mode.

12. The projection device according to claim 9, wherein one of the plurality of detection modules is an illuminance sensor, and one of the plurality of environment detection values is the environment illuminance value.

13. The projection device according to claim 9, wherein one of the plurality of detection modules is a current sensor, and one of the plurality of environment detection values is the volume load value of a speaker module.

14. The projection device according to claim 9, wherein one of the plurality of detection modules is a volume sensor, and one of the plurality of environment detection values is the environment volume value.

15. The projection device according to claim 9, wherein the control chip is configured to receive the plurality of the environment detection values within a time period, and determine whether a difference between a maximum value and a minimum value of the plurality of environment detection values is greater than a threshold value;

wherein when the difference is not greater than the threshold value, the control chip is configured to obtain the corresponding environment mode according to an average value of the plurality of environment detection values; and when the difference is greater than the threshold value, the control chip is configured to receive another plurality of environment detection values again from the plurality of detection modules in a next time period to obtain the corresponding environment mode.

16. The projection device according to claim 9, further comprising:

a light source module, coupled to the control chip, the control chip is configured to adjust a light power of the light source module according to the environment load value, wherein when the rotation speed of the fan module increases, the control chip is configured to increase the light power, and when the rotation speed of the fan module is reduced, the control chip is configured to decrease the light power.

17. A parameter adjustment method of a projection device, comprising:

receiving an environment detection value through a control chip from a detection module, wherein the detection module is a current sensor, and the environment detection value is a volume load value of a speaker module;

comparing the environment detection value with a reference range to obtain a corresponding environment mode; and adjusting a rotation speed of a fan module according to an environment load value corresponding to the environment mode.

18. A parameter adjustment method of a projection device, comprising:

receiving an environment detection value through a control chip from a detection module, wherein the environment detection value is an environment illuminance value, or a volume load value, or an environment volume value or any combination of the environment illuminance value, the volume load value, and the environment volume value;

comparing the environment detection value with a reference range to obtain a corresponding environment mode; and adjusting a rotation speed of a fan module according to an environment load value corresponding to the environment mode;

wherein the step of receiving the environment detection value through the control chip from the detection module further comprises:

receiving a plurality of the environment detection values within a time period;

determining whether a difference between a maximum value and a minimum value of the plurality of environment detection values is greater than a threshold value;

in response to the difference is not greater than the threshold value, obtaining the corresponding environment mode according to an average value of the plurality of environment detection values; and in response to the difference is greater than the threshold value, receiving another plurality of environment detection values again from the detection module in a next time period to obtain the corresponding environment mode.

19. A projection device, comprising:

a fan module;

a detection module, configured to sense an environment detection value, wherein the detection module is a current sensor, and the environment detection value is a volume load value of a speaker module; and a control chip, coupled to the fan module and the detection module, and the control chip is configured to receive the environment detection value from the detection module, and compare the environment detection value with a reference range to obtain a corresponding environment mode, and adjust a rotation speed of the fan module according to an environment load value corresponding to the environment mode.

20. A projection device, comprising:

a fan module;

a detection module, configured to sense an environment detection value, wherein the environment detection value is an environment illuminance value, or a volume load value, or an environment volume value or any combination of the environment illuminance value, the volume load value, and the environment volume value; and a control chip, coupled to the fan module and the detection module, and the control chip is configured to receive the environment detection value from the detection module, and compare the environment detection value with a reference range to obtain a corresponding environment mode, and adjust a rotation speed of the fan module according to an environment load value corresponding to the environment mode;

wherein the control chip is configured to receive a plurality of the environment detection values within a time period, and determine whether a difference between a maximum value and a minimum value of the plurality of environment detection values is greater than a threshold value;

wherein when the difference is not greater than the threshold value, the control chip is configured to obtain the corresponding environment mode according to an average value of the plurality of environment detection values; and when the difference is greater than the threshold value, the control chip is configured to receive another plurality of environment detection values again from the detection module in a next time period to obtain the corresponding environment mode.

* * * * *